(12) United States Patent
Liu et al.

(10) Patent No.: US 8,175,215 B2
(45) Date of Patent: May 8, 2012

(54) SHIFT REGISTER

(75) Inventors: Chun-Hsin Liu, Hsin-Chu (TW);
Tsung-ting Tsai, Hsin-Chu (TW);
Kuo-Chang Su, Hsin-Chu (TW);
Yung-Chih Chen, Hsin-Chu (TW)

(73) Assignee: AU Optronics Corp., Hsin-Chu (TW)

( * ) Notice: Subject to any disclaimer, the term of this patent is extended or adjusted under 35 U.S.C. 154(b) by 102 days.

(21) Appl. No.: 12/572,247

(22) Filed: Oct. 1, 2009

(65) Prior Publication Data

US 2010/0226473 A1 Sep. 9, 2010

(30) Foreign Application Priority Data

Mar. 5, 2009 (TW) ............................... 98107171 A

(51) Int. Cl.
*G11C 19/00* (2006.01)

(52) U.S. Cl. ................. 377/64; 377/68; 377/78; 377/79

(58) Field of Classification Search .......................... None
See application file for complete search history.

(56) References Cited

U.S. PATENT DOCUMENTS

| | | | |
|---|---|---|---|
| 5,222,082 A | 6/1993 | Plus | |
| 5,410,583 A | 4/1995 | Weisbrod et al. | |
| 5,517,542 A * | 5/1996 | Huq | 377/78 |
| 5,701,136 A * | 12/1997 | Huq et al. | 345/100 |
| 5,859,630 A * | 1/1999 | Huq | 345/100 |
| 5,949,398 A * | 9/1999 | Kim | 345/100 |
| 7,317,780 B2 | 1/2008 | Lin et al. | |
| 7,738,623 B2 * | 6/2010 | Tobita | 377/64 |
| 7,787,585 B2 * | 8/2010 | Cheng et al. | 377/64 |
| 2006/0146987 A1 * | 7/2006 | Haukilahti | 379/67.1 |
| 2007/0086558 A1 | 4/2007 | Wei et al. | |
| 2008/0101529 A1 * | 5/2008 | Tobita | 377/64 |
| 2009/0041177 A1 * | 2/2009 | Chien et al. | 377/64 |
| 2009/0304138 A1 * | 12/2009 | Tsai et al. | 377/79 |
| 2009/0304139 A1 * | 12/2009 | Tsai et al. | 377/79 |
| 2010/0150303 A1 * | 6/2010 | Tsai et al. | 377/79 |

* cited by examiner

Primary Examiner — Tuan T Lam

(57) ABSTRACT

A shift register includes multiple cascade-connected stages. Each stage generates an output signal in response to a clock signal and a first control signal. Each stage includes a pull-up module, a pull-up driving module, a first pull-down module, a second pull-down module, and a third pull-down module. The pull-up module is used for providing the output signal based on the clock signal. The pull-up driving module turns on the pull-up module in response to a first control signal. The first pull-down module adjusts voltage level on the first node to a first supply voltage in response to a second control signal. The second pull-down module adjusts voltage level on the output end to a second supply voltage in response to the second control signal. The third pull-down module adjusts voltage level on the second node to a third supply voltage in response to a third control signal.

11 Claims, 6 Drawing Sheets

SHIFT REGISTER

CLAIM OF PRIORITY

This application claims priority to Taiwanese Patent No. 098107171 filed on Mar. 5, 2009.

BACKGROUND OF THE INVENTION

1. Field of the Invention

The present invention relates to a shift register, and more particularly, to a shift register capable of compensating a threshold voltage variation of a transistor.

2. Description of the Related Art

With a rapid development of monitor types, novel and colorful monitors with high resolution, e.g., liquid crystal displays (LCDs), are indispensable components used in various electronic products such as monitors for notebook computers, personal digital assistants (PDAs), digital cameras, and projectors. The demand for the novelty and colorful monitors has increased tremendously.

Referring to FIG. 1 showing a functional block diagram of a conventional liquid crystal display 10, the liquid crystal display 10 includes a liquid crystal panel 12, a gate driver 14, and a source driver 16. The liquid crystal panel 12 includes a plurality of pixels, each pixel having three pixel units 20 indicating three primary colors of red, green, and blue. For example, the liquid crystal display 12 with 1024 by 768 pixels contains a number of 1024×768×3 pixel units 20. The gate driver 14 periodically outputs a scanning signal to turn on each transistor 22 of the pixel units 20 row by row, meanwhile, each pixel units 20 is charged to a corresponding voltage based on a data signal from the source driver 16, to show various gray levels. After a row of pixel units is finished to be charged, the gate driver 14 stops outputting the scanning signal to this row, and then outputs the scanning signal to turn on the transistors 22 of the pixel units of the next row. Sequentially, until all pixel units 20 of the liquid crystal panel 12 are finished charging, and the gate driver 14 outputs the scanning signal to the first row again and repeats the above-mentioned mechanism.

As to the conventional liquid crystal display, the gate driver 14 functions as a shift register. In other words, the gate driver 16 outputs a scanning signal to the liquid crystal display 12 at a fixed interval. For instance, a liquid crystal display 12 with 1024×768 pixels and its operating frequency with 60 Hz is provided, the display interval of each frame is about 16.67 ms (i.e., 1/60 second), such that an interval between two scanning signals being applied on two row adjacent lines is about 21.7 μs (i.e., 16.67 ms/768). The pixel units 20 are charged and discharged by data voltage from the source driver 16 to show corresponding gray levels in the time period of 21.7 μs accordingly.

Output of the transistor inside the gate driver 14 is pulled up because of the capacitance coupling effect between a drain and a gate when a clock signal is at high voltage level. This would probably lead to the transistor T2 being turned on unintentionally. In this way, each stage of the shift register outputs unexpected pulse, causing the panel to display abnormally. As for the gate driver 14 that is utilized in high resolution LCD panels, which are manufactured with amorphous silicon thin film processing technology, in particular, evenness and stability of components in the processes have great variability. So, if the transistor inside the gate driver 14 is turned on unintentionally after the LCD panel 12 is lightened, the damage to the LCD panel 12 would be extraordinarily serious.

SUMMARY OF THE INVENTION

It is therefore an object of the present invention to provide a shift register having multiple stages of which each transistor is for outputting pulse to pixels being turned off completely to prevent from turning on unintentionally when each stage is not enabled, therefore solving the problem of the prior art.

According to the present invention, a shift register comprises a plurality of cascade-connected stages, such that each stage is for generating an output signal at an output end based on a clock signal, and a first control signal. Each stage comprises a pull-up module, a pull-up driving module, a first pull-down module, a second pull-down module, and a third pull-down module. The pull-up module which is coupled to a first node is used for providing the output signal at the output end based on the clock signal. The pull-up driving module which is coupled to the first node is used for turning on the pull-up module in response to the first control signal. The first pull-down module which is coupled to the first node and a first supply voltage is used for adjusting voltage level on the first node to the first supply voltage in response to a second control signal. The second pull-down module which is coupled to the output end and a second supply voltage is used for adjusting voltage level on the output end to the second supply voltage in response to the second control signal. The third pull-down module which is coupled to a second node and a third supply voltage is used for adjusting voltage level on the second node to the third supply voltage in response to a third control signal.

In one aspect of the present invention, the first pull-down module comprises a first transistor comprising a drain which is coupled to the first node, a gate which is coupled to the second node, and a source which is coupled to the first supply voltage.

In another aspect of the present invention, the pull-up driving module comprises a second transistor comprising a drain and a gate which is coupled to the first control signal and a source which is coupled to the first node. The first control signal is from an output end of a previous stage.

In another aspect of the present invention, the third pull-down module comprises a third transistor comprising a drain, a gate, and a source which is coupled to the second node, the third control signal, and the third supply voltage, respectively. The third control signal is from an output end of a previous stage.

In another aspect of the present invention, the third pull-down module comprises a third transistor comprising a drain, a gate, and a source which is coupled to the second node, the first node, and the third supply voltage, respectively.

In another aspect of the invention, the pull-up module comprises a fourth transistor comprising a drain, a gate, and a source which is coupled to the clock signal, the first node, and the output end, respectively. The pull-up module comprises a sixth transistor comprising a drain, a gate, and a source which is coupled to the clock signal, the first node, and a driving signal end, respectively.

In another aspect of the present invention, the second pull-down module comprises a fifth transistor comprising a drain, a gate, and a source which is coupled to the output end, the second node, and the second supply voltage, respectively. The second pull-down module further comprises a seventh transistor comprising a drain, a gate, and a source which is coupled to a driving signal end, the second node, and the second supply voltage, respectively.

In still another aspect of the present invention, the voltage level of the third supply voltage is less than or equal to that of the first supply voltage. The voltage level of the first supply voltage is less than or equal to that of the second supply voltage.

The present invention will be described with reference to the accompanying drawings, which show exemplary embodiments of the present invention.

DETAILED DESCRIPTION OF THE PREFERRED EMBODIMENT

Figure 1:
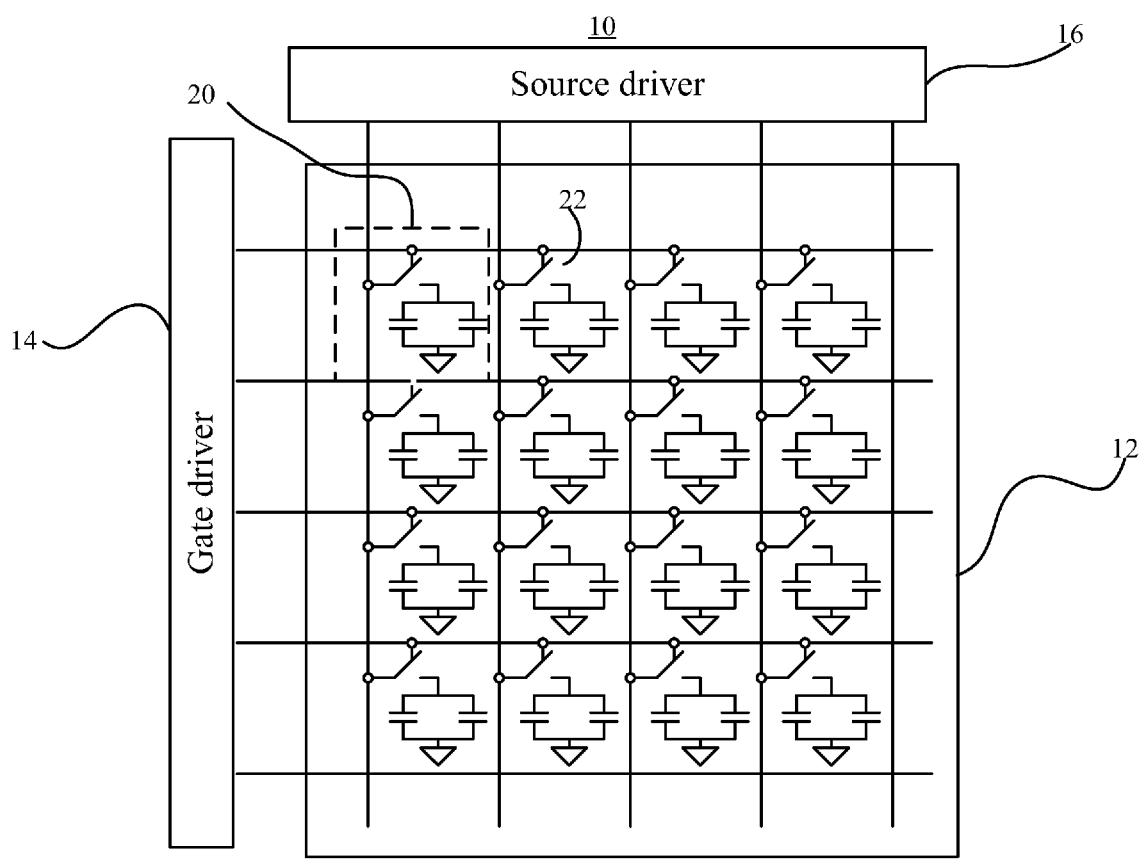
FIG. 1 shows a functional block diagram of a conventional liquid crystal display.
Figure 2:
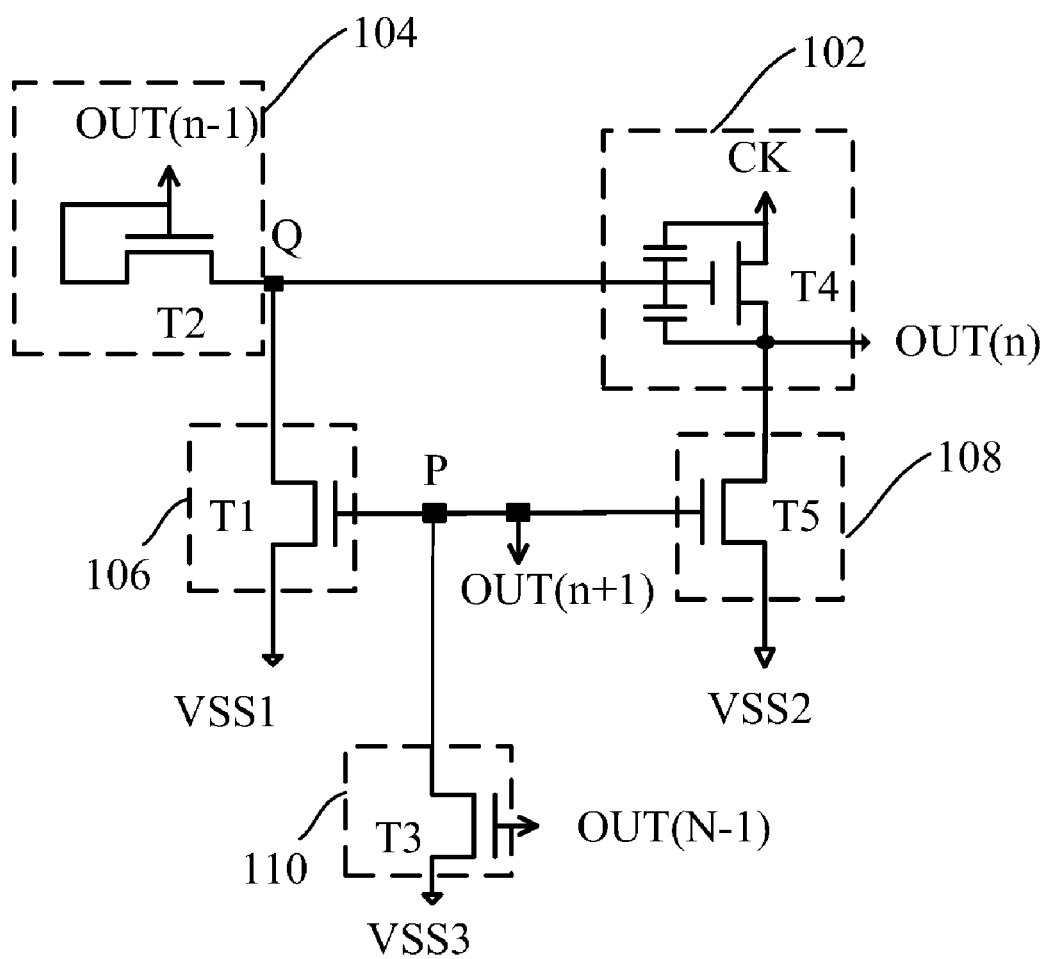
FIG. 2 shows a block diagram of a stage of the shift register according to a preferred embodiment of the present invention.

Referring to FIG. 2 showing a block diagram of a stage 100(n) of the shift register according to a preferred embodiment of the present invention, the shift register which may be used in a gate driver of a liquid crystal display comprises a plurality of cascade-connected stages 100(n). The stage 100(n) generates an output signal at the output end OUT(n) based on a clock signal CK, an output signal (i.e. a first control signal) at an output end OUT(n−1) of a previous one stage 100(n−1), and an output signal at an output end OUT(n+1) of a next one stage 100(n+1). Upon being triggered by a start pulse, the first stage 100(1) delays the start pulse by a half cycle of the clock signal CK, and outputs the delayed pulse at an output end OUT(1). Thereafter, the stage 100(2) outputs an output signal pulse at the output end OUT(2) by a half cycle of the clock signal CK, based on the output signal from the output end OUT(1), the output signal from the output end OUT(3), and the clock signal CK. The output signal is a scan signal to turn on transistors of the pixels on a panel.

Each stage 100(n) comprises a pull-up module 102, a pull-up driving module 104, a first pull-down module 106, a second pull-down module 108, and a third pull-down module 110. The pull-up module 102 which is coupled to a first node Q is used for providing the output signal at the output end OUT(n) based on the clock signal CK. The pull-up driving module 104 which is coupled to the first node Q is used for turning on the pull-up module 102 in response to the output signal (i.e. the first control signal) at the output end OUT(n−1) based on the clock signal CK. The first pull-down module 106 which is coupled to the first node Q and a first supply voltage VSS1 is used for adjusting voltage level on the first node Q to the first supply voltage VSS1 in response to a second control signal (i.e. voltage level on a second node P). The second pull-down module 108 which is coupled to the output end OUT(n) and a second supply voltage VSS2 is used for adjusting voltage level on the output end OUT(n) to the second supply voltage VSS2 in response to the second control signal (voltage level on the second node P). The third pull-down module 110 which is coupled to a second node P and a third supply voltage VSS3 is used for adjusting voltage level on the second node P tending to the third supply voltage VSS3 in response to a third control signal (i.e. voltage level on the output end OUT(n−1)).

In the present invention, the voltage level of the third supply voltage VSS3 is less than or equal to that of the first supply voltage VSS1, and the voltage level of the first supply voltage VSS1 is less than or equal to that of the second supply voltage VSS2. For the convenience of the explanation, the following operation of the present embodiment will set the voltage level of the first supply voltage VSS1 as −9V, that of the third supply voltage VSS3 as −9V or lower, and that of the second supply voltage VSS2 as −6V.

The first pull-down module 106 is implemented by a first transistor T1 which comprises a drain being coupled to the first node Q, a gate being coupled to a second node P, and a source being coupled to a first supply voltage VSS1. The pull-up driving module 102 is implemented by a second transistor T2 which comprises a drain and a gate which is coupled to an output end OUT(n−1) of a previous stage 100(n−1) and a source which is coupled to the first node Q. The third pull-down module 110 is implemented by a third transistor T3 which comprises a drain, a gate, and a source which is coupled to the second node P, the third control signal, and the third supply voltage VSS3, respectively. In the present embodiment, the third control signal is from an output end OUT(n−1) of the previous stage 100(n−1). The second pull-down module 108 is implemented by a fifth transistor T5 which comprises a drain, a gate, and a source which is coupled to the output end OUT(n), the second node P, and the second supply voltage VSS2, respectively. The pull-up module 102 is implemented by a fourth transistor T4 which comprises a drain, a gate, and a source which is coupled to the clock signal CK, the first node Q, and the output end OUT(n), respectively.

Figure 3:
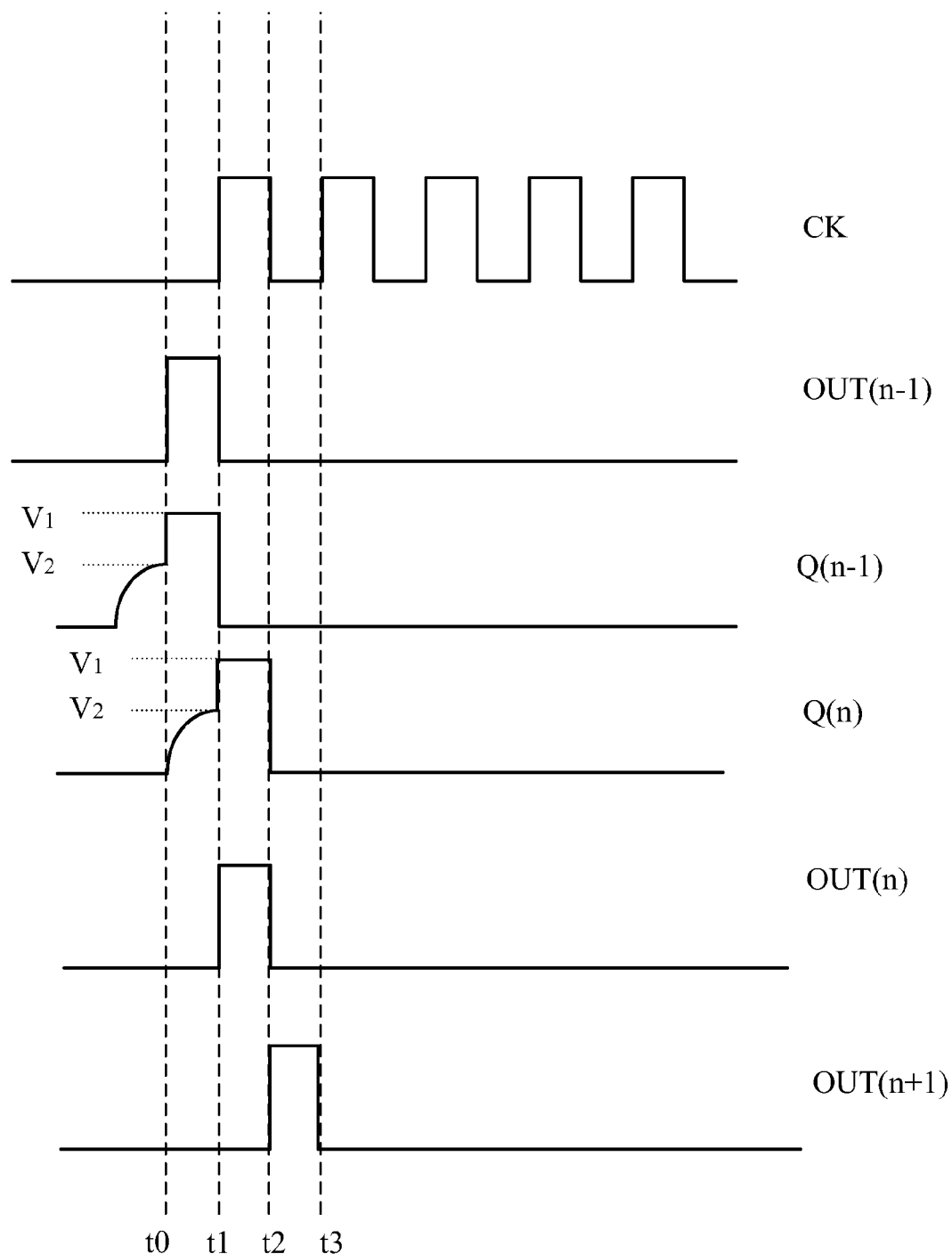
FIG. 3 shows a timing diagram of each signal and node in FIG. 2.

Referring to both of FIG. 2 and FIG. 3, FIG. 3 shows a timing diagram of each signal and node in FIG. 2. In the time period of t0-t1, the clock signal CK is at low voltage level whilst the output signal of the output end OUT(n−1) of the previous stage 100(n−1) is at high voltage level, which causes the transistors T2 and T3 to be turned on. At this time, the electrical potential of the node Q starts to be pulled up whilst the electrical potential of the node P is −9V. Because the gate-source voltage drops (Vgs) of the transistors T1 and T5 are less than or equal to 0V, neither of the transistors T1 and T5 can be turned on at this time.

In the time period of t1-t2, the clock signal CK is at high voltage level whilst the output signal of the output end OUT(n−1) of the previous stage 100(n−1) is at low voltage level, which causes the transistor T3 to be turned off. However, because of capacitance effect, the floating electrical potential of the node Q would jump to voltage level $V_1$ from voltage level $V_2$ with the transition of the clock signal CK. Following the electrical potential of the node Q jumping to voltage level V1, the transistor T4 is turned on to deliver the clock signal CK, which causes the output end OUT(n) to output a high voltage level.

In the time period of t2-t3, both of the clock signal CK and the output signal of the output end OUT(n−1) are at low voltage level whilst the output signal of the output end OUT(n+1) of the following stage 100(n+1) is at high voltage level, which causes the transistors T2 and T3 to be turned off but the transistors T1 and T5 to be turned on. Meanwhile, the electrical potential of the node Q starts to be pulled down to −9V (i.e., VSS1) because of the turn-on of the transistor T1. Also, the electrical potential of the output end OUT(n) starts to be pulled down to −6V (i.e., VSS2) because of the turn-on of the transistor T5. In this way, the gate-source voltage drop (Vgs) of the transistor T4 is equal to −3V, which is obviously less than 0V, so that the transistor T4 is forced to be turned off completely, thus leading to a huge decrease in current leakage. In other words, the probability that the transistor T4 is turned on unintentionally can be decreased hugely as well, this lowers the possibility that pixels on a panel are charged unintentionally.

Figure 4:
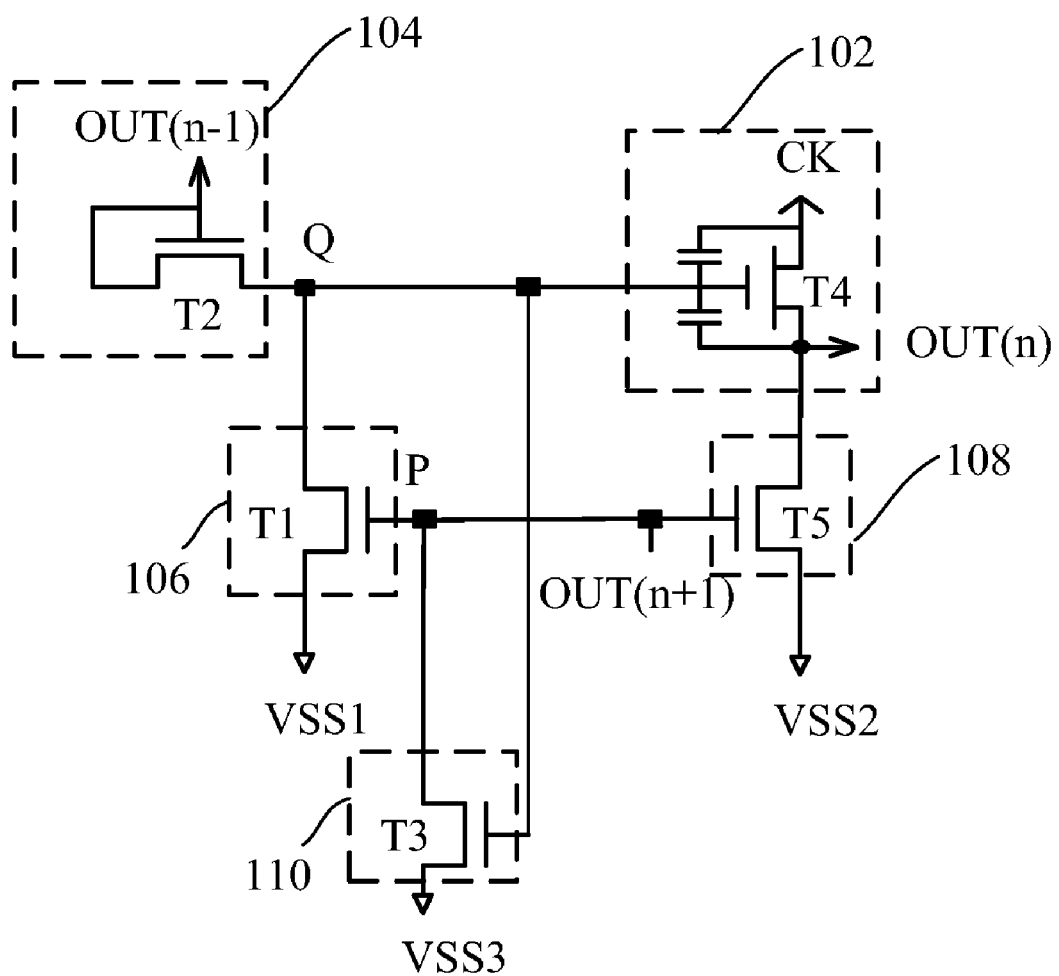
FIG. 4 shows a circuit diagram of a stage of the shift register according to the second embodiment of the present invention.

Referring to FIG. 4, FIG. 4 shows a circuit diagram of a stage 200(n) of the shift register according to the second embodiment of the present invention. The shift register which may be used in a gate driver of a liquid crystal display comprises a plurality of cascade-connected stages 200(n). Each stage 200(n) is similar to the stage 100(n) except for the gate of the third transistor T3 coupling to the first Q. the third transistor T3 is used for adjusting the electrical potential of the node P to match the magnitude of the third supply voltage VSS3 in response to the third control signal, i.e. the voltage level of the first node Q.

Referring to both of FIG. 3 and FIG. 4, in the time period of t0-t1, the clock signal CK is at low voltage level whilst the output signal of the output end OUT(n−1) of the previous stage 100(n−1) is at high voltage level, which causes the transistor T2 to be turned on. At this time, the electrical potential of the node Q starts to be pulled up to turn on the third transistor T3 whilst the electrical potential of the node P is −9V. Because the gate-source voltage drops (Vgs) of the transistors T1 and T5 are less than or equal to 0V, neither of the transistors T1 and T5 can be turned on at this time.

In the time period of t1-t2, the clock signal CK is at high voltage level whilst the output signal of the output end OUT (n−1) of the previous stage 100(n−1) is at low voltage level, which causes the transistor T3 to be turned off. However, because of capacitance effect, the floating electrical potential of the node Q would jump to voltage level $V_1$ from voltage level $V_2$ with the transition of the clock signal CK. Following the electrical potential of the node Q jumping to voltage level V1, the transistor T4 is turned on to deliver the clock signal CK, which causes the output end OUT(n) to output a high voltage level. At this time, since the electrical potential of the node Q remains, the turn-on third transistor T3 keeps the electrical potential of the node P at −9V. Because the gate-source voltage drops (Vgs) of the transistors T1 and T5 are less than or equal to 0V, neither of the transistors T1 and T5 are still turned on at this time.

In the time period of t2-t3, both of the clock signal CK and the output signal of the output end OUT(n−1) are at low voltage level whilst the output signal of the output end OUT (n+1) of the following stage 100(n+1) is at high voltage level, which causes the transistors T2 and T3 to be turned off but the transistors T1 and T5 to be turned on. Meanwhile, the electrical potential of the node Q starts to be pulled down to −9V (i.e., VSS1) because of the turn-on of the transistor T1. Also, the electrical potential of the output end OUT(n) starts to be pulled down to −6V (i.e., VSS2) because of the turn-on of the transistor T5. In this way, the gate-source voltage drop (Vgs) of the transistor T4 is equal to −3V, which is obviously less than 0V, so that the transistor T4 is forced to be turned off completely, thus leading to a huge decrease in current leakage. In other words, the probability that the transistor T4 is turned on unintentionally can be decreased hugely as well, this lowers the possibility that pixels on a panel are charged unintentionally.

Figure 5:
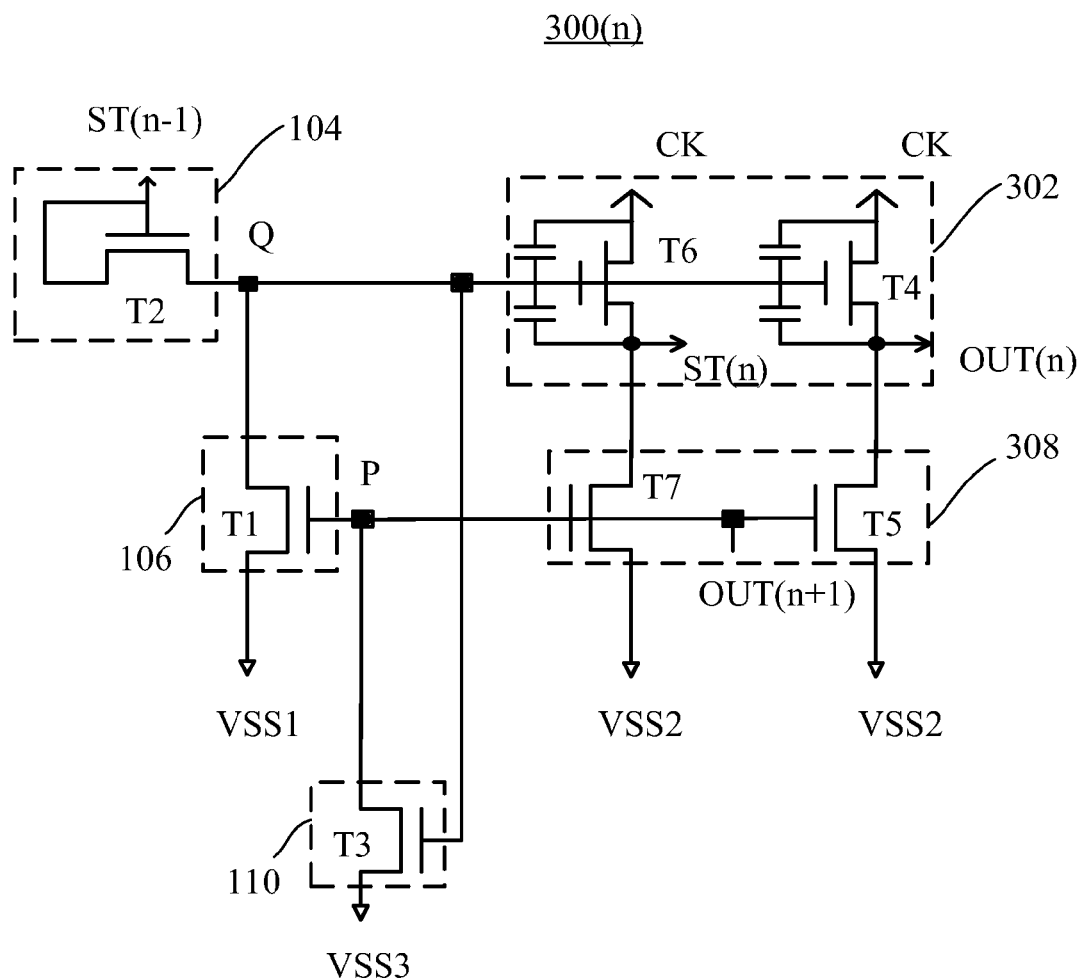
FIG. 5 illustrates a circuit diagram of a stage of the shift register according to the third embodiment of the present invention.

Referring to FIG. 5 illustrating a circuit diagram of a stage 300(n) of the shift register according to the third embodiment of the present invention, the shift register comprises a plurality of cascade-connected stages 300(n). The stage 300(n) is used to generate an output signal and a driving signal pulse from the output end OUT(n) and driving signal end ST(n) of each stages 300(n), respectively, according to the clock signal CK and the driving signal pulse of the driving signal end ST(n−1) of the stage 300(n−1). Upon being triggered by a start pulse Vst at the driving signal end ST(0), the first stage 300(1) delays the start pulse by a half cycle of the clock signal CK, and outputs the delayed pulse at an output end OUT(1). Next, each stage 300(n) outputs an output signal via the output end OUT(n) every clock cycle, according to the clock signal CK and the driving signal pulse outputted through the driving signal end ST(n−1) of the stage 300(n−1). The output signal, i.e., a scanning signal pulse, is utilized to turn on its corresponding pixel transistor.

Each stage 300(n) comprises a pull-up module 302, a pull-up driving module 104, a first pull-down module 106, a second pull-down module 308, and a third pull-down module 110. The stage 300(n) in FIG. 5 is similar to the stage 200(n) in FIG. 4 except for the pull-up module 302 comprises the fourth transistor T4 and the sixth transistor T6. The drain, the gate, and the source of the fourth transistor T4 are coupled to the clock signal CK, the first node Q, and the output end OUT(n), respectively. The drain, the gate, and the source of the sixth transistor T6 are coupled to the clock signal CK, the first node Q, and the driving signal end ST(n), respectively. In addition, the second pull-down module 308 comprises the fifth transistor T5 and the seventh transistor T7. The drain, the gate, and the source of the fifth transistor T5 are coupled to the output end OUT(n), the second node P, and the second supply voltage VSS2, respectively. The drain, the gate, and the source of the seventh transistor T7 are coupled to the driving signal end ST(n), the output signal (i.e., signal being applied on the node P) of the output end OUT(n+1) of the next stage 100(n+1), and the second supply voltage VSS2, respectively.

In the present invention, the voltage level of the third supply voltage VSS3 is less than or equal to that of the first supply voltage VSS1, and the voltage level of the first supply voltage VSS1 is less than or equal to that of the second supply voltage VSS2. For the convenience of the explanation, the following operation of the present embodiment will set the voltage level of the first supply voltage VSS1 as −9V, that of the third supply voltage VSS3 as −9V or lower, and that of the second supply voltage VSS2 as −6V.

Figure 6:
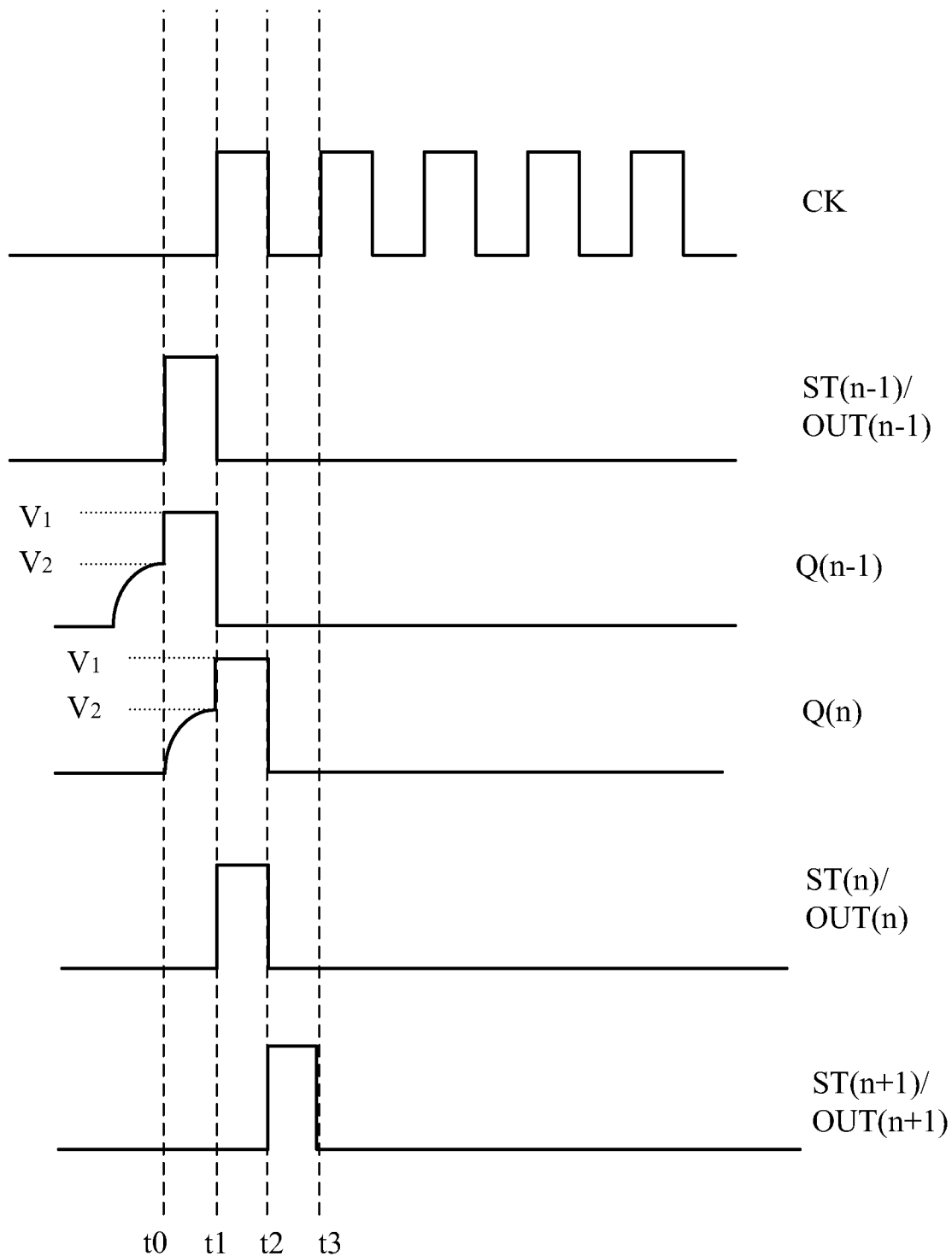
FIG. 6 demonstrates a timing diagram of each signal and node in FIG. 5.

Referring to both of FIG. 5 and FIG. 6, FIG. 6 demonstrates a timing diagram of each signal and node in FIG. 5. In the time period of t0-t1, the clock signal CK is at low voltage level whilst the output signal of the driving signal end ST(n−1) of the previous stage 100(n−1) is at high voltage level, this causes the transistors T2 and T3 to be turned on. At this time, the electrical potential of the node Q starts to be pulled up whilst the electrical potential of the node P is −9V. Because the gate-source voltage drops (Vgs) of the transistors T1, T5, and T7 are less than or equal to 0V, none of the transistors T1, T5, and T7 can be turned on at this time.

In the time period of t1-t2, the clock signal CK is at high voltage level whilst the driving signal of the driving signal end ST(n−1) of the previous stage 100(n−1) is at low voltage level, this causes the transistor T3 to be turned off. However, because of capacitance effect, the floating electrical potential of the node Q would jump to voltage level V1 from voltage level V2 with the transition of the clock signal CK. Following the electrical potential of the node Q jumping to voltage level V1, the transistors T4 and T6 are turned on to deliver the clock signal CK, this causes the output end OUT(n) and the driving signal end ST(n), respectively, to output a high voltage level.

In the time period of t2-t3, both of the clock signal CK and the driving signal of the driving signal end ST(n−1) of the stage 100(n−1) are at low voltage level whilst the output signal of the output end OUT(n+1) of the following stage 100(n+1) is at high voltage level, this causes the transistors T2 and T3 to be turned off but the transistors T1, T5, and T7 to be turned on. Meanwhile, the electrical potential of the node Q starts to be pulled down to −9V (i.e., VSS1) because of the turn-on of the transistor T1. Also, the electrical potential of the output end OUT(n) starts to be pulled down to −6V (i.e., VSS2) because of the turn-on of the transistor T5. In this way, the gate-source voltage drops (Vgs) of the transistors T4 and T6 is equal to −3V, which is obviously less than 0V, so the transistors T4 and T6 are forced to be turned off completely, thus leading to a huge decrease in current leakage. In other words, the probability that the transistors T4 and T6 are turned on unintentionally can be decreased hugely as well, this lowers the possibility that pixels on a panel are charged unintentionally.

In contrast to prior art, each stage of the shift register of the present invention utilizes the first and the third pull-down modules to cause the gate-source voltage drops (Vgs) of the transistor T4 to be less than 0V to turn off the transistor T4 completely when the pull-up modules are turned off. So, the probability that the transistor T4 is turned on unintentionally can be decreased hugely, this lowers the possibility that pixels on a panel are charged unintentionally. Even if the difference between the manufacturing processes of transistors leads to a slight variation of the leakage current corresponding to the gate-source voltage drop (Vgs) at 0V, a decrease in the magnitude of the leakage currents will even exceed 100 times the original one as long as the gate-source voltage drops (Vgs) lowers to −3V or even lower. Therefore, comparing with the gate-source voltage drop (Vgs), the variations of the leakage currents of the transistors due to the difference of the manufacturing processes is not worth mentioning.

Although the present invention has been explained by the embodiments shown in the drawings described above, it should be understood to the ordinary skilled person in the art that the invention is not limited to the embodiments, but rather various changes or modifications thereof are possible without departing from the spirit of the invention. Accordingly, the scope of the invention shall be determined only by the appended claims and their equivalents.

What is claimed is:

1. A shift register comprising:
    a plurality of cascade-connected stages, each stage for generating an output signal at an output end based on a clock signal, a first control signal, each stage comprising:
        a pull-up module coupled to a first node, for providing the output signal at the output end based on the clock signal;
        a pull-up driving module coupled to the first node, for turning on the pull-up module in response to the first control signal;
        a first pull-down module coupled to the first node and a first supply voltage, for adjusting voltage level on the first node to the first supply voltage in response to a second control signal;
        a second pull-down module coupled to the output end and a second supply voltage, for adjusting voltage level on the output end to the second supply voltage in response to the second control signal, the voltage level of the first supply voltage being less than that of the second supply voltage; and
        a third pull-down module coupled to a second node and a third supply voltage, for adjusting voltage level on the second node to the third supply voltage in response to a third control signal, the voltage level of the third supply voltage being less than that of the first supply voltage.

2. The shift register of claim 1, wherein the first pull-down module comprises a first transistor of which comprises a drain coupled to the first node, a gate coupled to the second node, and a source coupled to the first supply voltage.

3. The shift register of claim 1, wherein the pull-up driving module comprises a second transistor of which comprises a drain and a gate coupled to the first control signal and a source coupled to the first node.

4. The shift register of claim 3, wherein the first control signal is from an output end of a previous stage.

5. The shift register of claim 1, wherein the third pull-down module comprises a third transistor of which comprises a drain, a gate, and a source coupled to the second node, the third control signal, and the third supply voltage, respectively.

6. The shift register of claim 5, wherein the third control signal is from an output end of a previous stage.

7. The shift register of claim 1, wherein the third pull-down module comprises a third transistor of which comprises a drain, a gate, and a source coupled to the second node, the first node, and the third supply voltage, respectively.

8. The shift register of claim 1, wherein the pull-up module comprises a fourth transistor of which comprises a drain, a gate, and a source coupled to the clock signal, the first node, and the output end, respectively.

9. The shift register of claim 8, wherein the pull-up module comprises a sixth transistor of which comprises a drain, a gate, and a source coupled to the clock signal, the first node, and a driving signal end, respectively.

10. The shift register of claim 1, wherein the second pull-down module comprises a fifth transistor of which comprises a drain, a gate, and a source coupled to the output end, the second node, and the second supply voltage, respectively.

11. The shift register of claim 10, wherein the second pull-down module further comprises a seventh transistor of which comprises a drain, a gate, and a source coupled to a driving signal end, the second node, and the second supply voltage, respectively.

* * * * *